United States Patent [19]

Scott

[11] 4,160,245

[45] Jul. 3, 1979

[54] APPARATUS FOR CONVERTING DIGITAL ANGULAR DATA INTO ANALOG SINE AND COSINE COMPONENTS

[75] Inventor: Charles H. Scott, Phoenix, Ark.

[73] Assignee: Sperry Rand Corporation, New York, N.Y.

[21] Appl. No.: 781,894

[22] Filed: Mar. 28, 1977

[51] Int. Cl.² .............................................. H03K 13/02
[52] U.S. Cl. .............................. 340/347 SY; 318/569; 318/661; 340/347 DA; 340/347 M
[58] Field of Search .... 340/347 SY, 347 M, 347 DA; 235/186, 197; 318/569, 661; 364/607

[56] References Cited

U.S. PATENT DOCUMENTS

| | | | |
|---|---|---|---|
| 3,675,234 | 7/1972 | Metz | 340/347 SY X |
| 3,696,407 | 10/1972 | Egerton | 340/347 M X |
| 3,827,045 | 7/1974 | Markus | 340/347 SY X |
| 4,072,940 | 2/1978 | Simon et al. | 340/347 SY |

Primary Examiner—Thomas J. Sloyan
Attorney, Agent, or Firm—Howard P. Terry; Albert P. Cefalo

[57] ABSTRACT

In an illustrative embodiment of the invention, an angular digital-to-resolver data converter apparatus is provided for converting a digital input signal representative of angular data into digital pseudo sine and cosine output signals representative of the angular data, which when converted into analog signals may be used to provide excitation to analog servo system resolvers. The digital or binary output signals which approximate the sine and cosine function of the digital angular data input signal are related such that the ratio of the digital output signal representative of the pseudo sine function to the digital output signal representative of the pseudo cosine function equals the true tangent of the actual angle.

7 Claims, 6 Drawing Figures

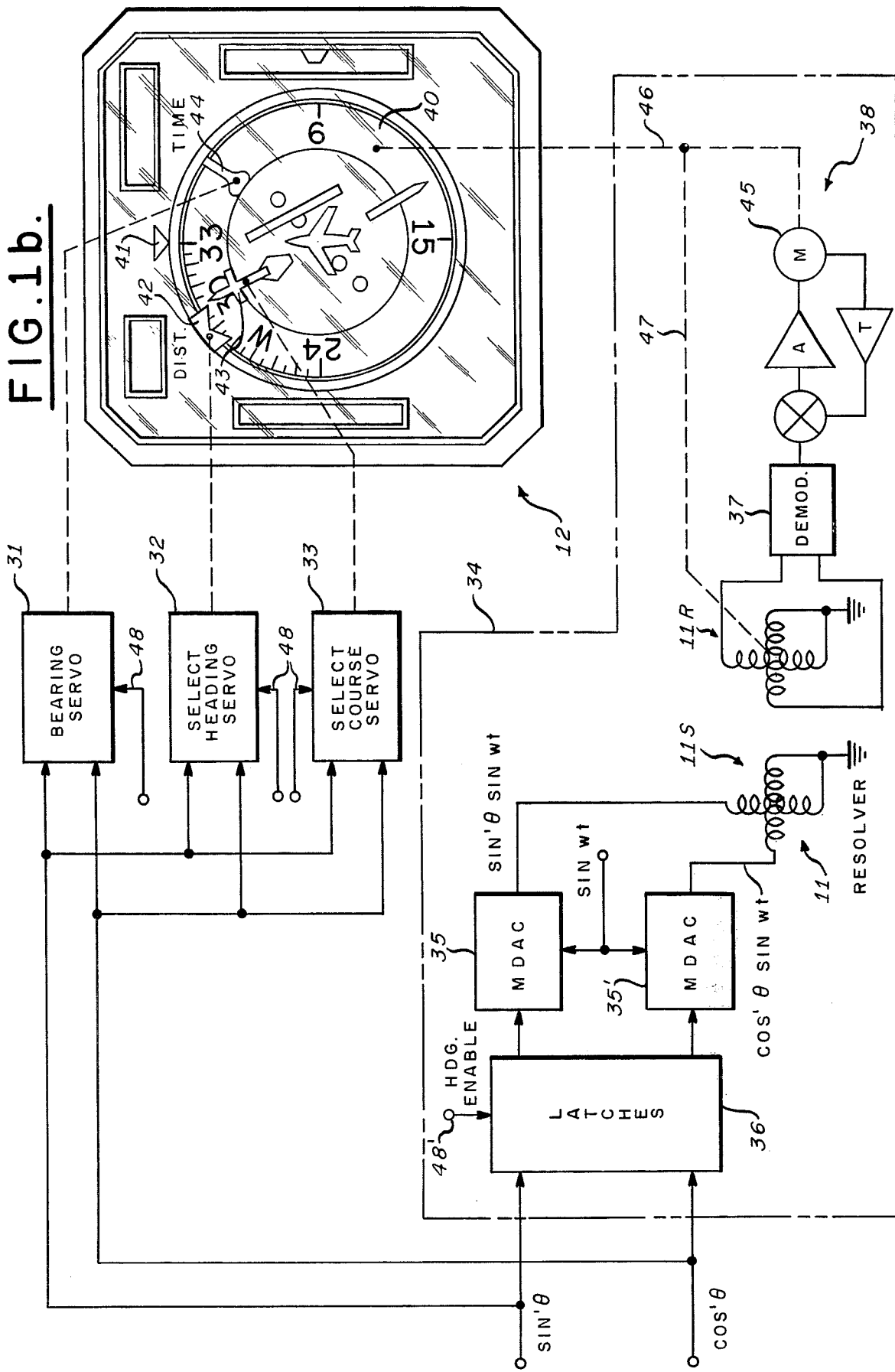

APPARATUS FOR CONVERTING DIGITAL ANGULAR DATA INTO ANALOG SINE AND COSINE COMPONENTS

BACKGROUND OF THE INVENTION

1. Field of the Invention

This invention relates to apparatus for converting digital angular data signals into analog sine and cosine components thereof for use as analog resolver input signals.

2. Description of the Prior Art

In many systems such as avionic navigation apparatus it is desirable to produce at one location an indication of angular data measured or established at another location. For example, in an aircraft navigation instrument display system, angular compass data representative of Heading, Heading Select, Course Select, and Bearing are generated at remote locations and displayed to the pilot on a panel mounted indicator such as a horizontal situation indicator or HSI. The remotely generated data may be repeated on the HSI by analog servo loops controlled by resolvers excited by sine and cosine components of the input angle. That is, the sine and cosine component inputs to the resolver stator are used as the position reference for the servomotor loop to position the indicator display member at the angle corresponding to the angle of the input or command data. The rotor of the resolver is mechanically coupled to the indication device and is rotated by the display servomotor to provide a feedback to the servo loop to zero the input when position agreement is achieved.

Conventionally, this data is supplied to the indicator in analog format such as by a three wire synchro data transmission system which is used to control position servo loops through analog electronics and electric motors for mechanically driving the HSI indicator elements.

In many future avionic systems the navigational angular data will be supplied in digital format from, for example, a digital area navigation computer, and in most cases in accordance with ARINC standards. Typical of such data is compass system data. Accordingly, for at least some of these future avionic systems, it will be necessary to provide apparatus for converting the digital angular data into analog sine and cosine components for excitation of the resolver receiver of an analog servosystem.

One method of obtaining the sine and cosine of the angle is performed by addressing a memory in which the sine or cosine for each individual digital angular data word is stored for "look up" purposes. And, the cosine or sine, respectively, may be trigonometrically determined from the aforementioned "look up" of the sine or cosine. In this system, however, as the sine and cosine functions are symmetric and repetitive functions the memory must encompass at least the sine or cosine function for each digital angular data word generated for 90° of data angle. Accordingly, depending upon the resolution or accuracy of the digital angular data word, that is, the number of words used to describe 90° of data, the size of the memory may be economically impractical. For example, for a 12 bit resolution of a digital angular data word the presently available 10 bit sine or cosine digital memory tables would necessarily have to quadruple in size.

Furthermore, a great many methods and techniques have been proposed in the past for converting a digital signal representing angular data into an analog signal representing this data but the present inventor is unaware of any method or technique which provides the accuracy or resolution of the present apparatus with a minimum memory capacity.

Accordingly, there is a need to provide a simple, relatively inexpensive but reliable apparatus which converts digital angular data into analog sine and cosine components for use in driving a 360° rotational device, such as a HSI display while achieving a 12 bit resolution with currently available memory sizes.

SUMMARY OF THE INVENTION

In accordance with the teachings of the present invention, conversion of angle data in digital format, such as in fractional binary coded format as specified by ARINC standards, to analog sine and cosine values suitable for the excitation of a resolver device, is accomplished with a minimum of converter equipment yet with a high degree of precision. This is accomplished by deriving from the input angle data, binary coded pseudo sine and pseudo cosine signals using a special ROM or PROM look-up table which recognizes that the ratio of the pseudo sine and pseudo cosine values is always equal to the tangent of the true angle (since the angular orientation of the resultant electrical vector in a resolver type of device is the ratio of the voltages supplied to the sine and cosine windings thereof).

It is well known that the sine function varies substantially linearly in the quadrants 315° to 45° and 135° to 225° and the cosine function varies substantially linearly in the quadrants 45° to 135° and 225° to 315°, and that the sine varies substantially non-linearly in quadrants 45° to 135° and 225° to 315° while the cosine varies similarly non-linearly in quadrants 315° to 45° and 135° to 225°. From the foregoing, it will be appreciated that in each octant a pseudo sine ($\sin'\theta$) and a pseudo cosine ($\cos'\theta$) function may be represented by a substantially linear or straight line sector and a substantially non-linear or curved line sector respectively or vice versa, the ratio of which is equal to the true tangent function. Taking one octant as an example, i.e., 0° to 45°, the pseudo sine is substantially linear while the pseudo cosine is curved. However, since the tangent is the ratio of the sine to the cosine, it is only necessary to obtain those non-linear pseudo cosine values which with the linear pseudo sine values will produce the tangent; i.e., $\cos'\theta = \sin'\theta/\tan\theta$. In the second octant, i.e., 45° to 90° the pseudo cosine is substantially linear and the pseudo sine is substantially non-linear, both being mirror images of the pseudo sine and pseudo cosine in the first octant; therefore, the same non-linear values of the first octant will satisfy the pseudo sine/pseudo cosine ratio in the second octant with suitable inversion and switching to maintain the proper ratio. As the pseudo sine and pseudo cosine data is in binary format, the non-linear values required to provide the proper ratio for only one octant need be stored in a single low capacity ROM and read out thereof may be performed by proper addressing in accordance with the octant in which the input angle lies.

Once the pseudo sine and pseudo cosine values in binary format are stored in suitable registers, they may be called out as needed and applied to conventional multiplying digital to analog converters wherein multiplication by standard 400 Hz reference takes place and the analog resultant thereof applied to the sine and cosine windings of the synchro resolver device for use by the analog servoloop.

BRIEF DESCRIPTION OF THE DRAWINGS

FIGS. 1A and 1B constitute a block diagram of a preferred embodiment of the invention as coupled to a servo resolver and an avionic navigational indicator.

DETAILED DESCRIPTION OF THE PREFERRED EMBODIMENT

Before describing a preferred embodiment of the present invention, it will be helpful to consider the following basic premise which lead to its conception. The ARINC standard for the transmission of 360° angular data, such as compass data, in digital format is a 32 bit serial word, the first 8 bits of which are used to identify the compass data function it represents; the last bit for parity and 13 bits to define the actual angle data, wherein the two MSB's thereof are together interpreted to be the sign bit, resulting in 12 bits of input angle data the remaining bits of the 32 bit serial word may be used for other purposes. This 12 bit word is interpreted by ARINC to represent the angle data in fractional binary coded format as illustrated in the following Table I. It should be recognized of course that the invention is not restricted to this data format and is applicable to any binary number with more than three bits.

full range or approximately 0.088°. As illustrated by Table II the binary number represents a summation or count of quantum of angle; the twelfth bit angular number is 1/4096 of 360° which equals approximately 0.088 degrees as in Table I. However, in this representation of the digital angle, the least significant bit (LSB) or bit #12 has a summation or count of quantum of angle equal to one, that is, representative of 0.088°; the 2nd LSB has a count equal to two or twice the least LSB and is approximately equal to 0.176°; and so forth up to the 1st MSB which is equal to a count of 2,048 or 180°, which for the full summation or count of quantum of angle for the twelve binary number equals 4,095 for a full rotation of 360°–0.088°. Although either interpretation of the twelve bit binary number as represented by Table I or Table II is equally applicable to the invention, the summation or count of quantum of angle interpretation represented by Table II is especially useful in understanding the conversion of the digital angle data $\theta$ into pseudo sine and cosine components thereof by the apparatus of a preferred embodiment of this invention.

Figure 2:
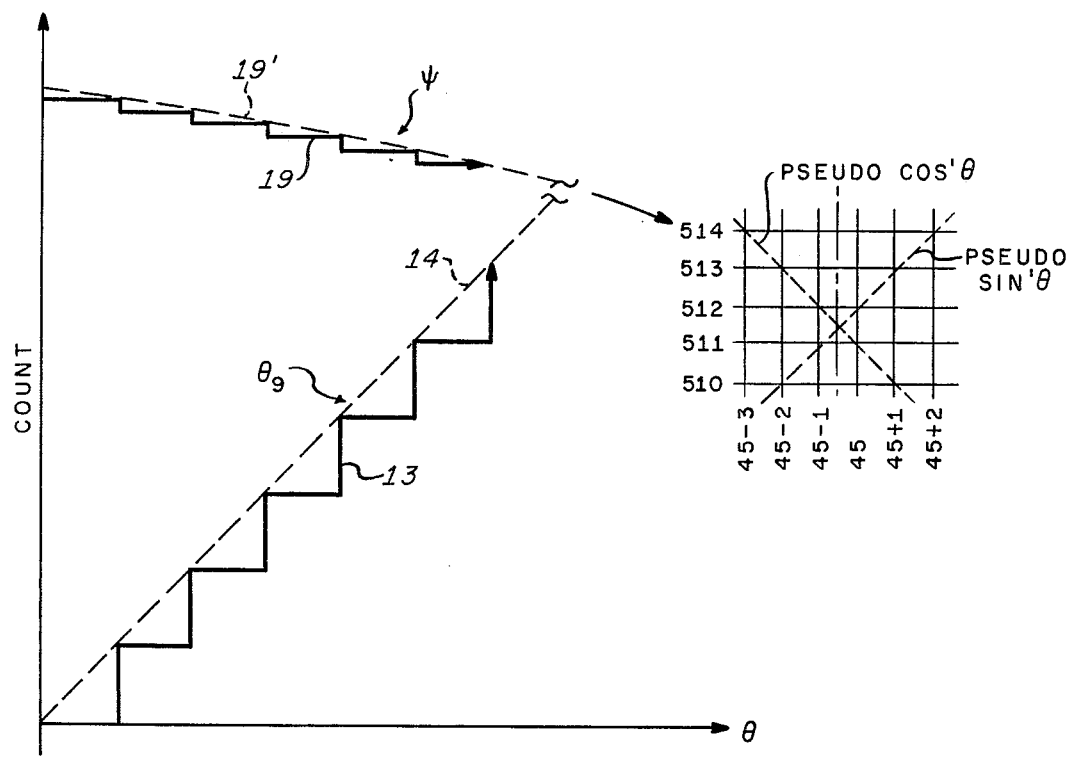
FIGS. 2, 3, 4A and 4B are graphs useful in explaining the principles of the invention.

Referring now to FIG. 2 and Table II, the summation or count of quantum of angle $\theta$ of a twelve bit digital angular data number is one less than $2^{12}$ or one less than 4,096. The summation or count of quantum of angle for a twelve bit digital number is a step wise or staircase increase from zero to 4,095 for each increase in quantum of angle, a portion thereof being shown by the greatly enlarged staircase curve 13. As an approximation, the summation or count of a 12 bit digital angular data

TABLE I

| BIT NO. | 1 (MSB) | 2 | 3 | 4 | 5 | 6 | 7 | 8 | 9 | 10 | 11 | 12 |
|---|---|---|---|---|---|---|---|---|---|---|---|---|
| | SIGN BIT | RANGE BITS (RANGE = 180°) | | | | | | | | | | |
| Bit Fractional Value of Full Range | +/− | $2^{-1}$ (1/2) | $2^{-2}$ (1/4) | $2^{-3}$ (1/8) | $2^{-4}$ (1/16) | | | | | | | $2^{-11}$ (1/2048) |
| Bit Weight in Degrees | | 90 | 45 | 22.5 | 11.25 | | | | | | | Appox .088 |

Note that the Resolution = 1/2048 of 180° = Approx. .088°.

In order to provide an understanding of the present invention, this same fractional binary number format may be interpreted in another way; that is, as a summation or count of quantum angle. This interpretation is set forth below in Table II.

number or the step wise increase 13 may be considered as a straight line from zero to 4,095 over the 360° angular range, a portion of this line being shown by dashed line 14 in FIG. 2. In addition, from Table II it is noted that if the three most significant bits or 3 MSB's of the

TABLE II

| BIT NO. | 1 (MSB) | 2 | 3 | 4 | 5 | 6 | 7 | 8 | 9 | 10 | 11 | 12 |
|---|---|---|---|---|---|---|---|---|---|---|---|---|
| No. of Quantum/Bit | $2^{11}$ (2048) | $2^{10}$ (1024) | $2^{9}$ (512) | $2^{8}$ (256) | $2^{7}$ (128) | | | | | | | $2^{0}$ (1) |
| Bit Weight in Degrees | 180 | 90 | 45 | 22.5 | 11.25 | | | | | | | Approx .088 |

With this interpretation, it will be noted that the quantum of angle for a 12 bit angular number is 1/4096 of 360° or approximately 0.088°, the same accuracy or resolution as in the ARINC interpretation.

Figure 3:
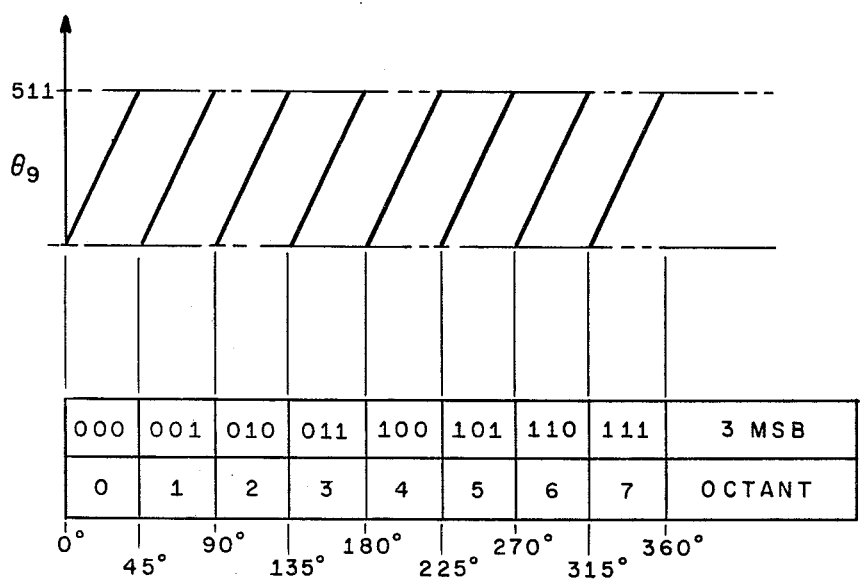

Referring to Table I it is noted that the 12 bits cover a range of ±180 degrees wherein the first bit or the first most significant bit (MSB) represents the sign (+ or −) of the angle and the bits following the first MSB represent a fractional value of the signed 180° range in fractional binary form. Accordingly, the 2nd MSB represents one-half of the full range or 90°, the 3rd MSB represents one-quarter of the full range or 45° and so forth to the twelfth bit which represents 1/2048 of the 12 bit digital number data are removed for octant identification, the remaining bits $\theta_9$ define a repetitive sawtooth-like curve, having linear portions covering 45° or octants of the full 360° angle, see FIG. 3. The three most significant bits (3 MSB's) of the digital angle $\theta$ input may therefore be used to identify each octant from zero to 360°, and may be used to control logic means for appropriate inversion and switching of the remaining bit values to achieve the proper slopes and signs of the summations to represent the pseudo sine and pseudo cosine relationships and to properly store these values in corresponding output registers, as will be described.

Figure 4A:
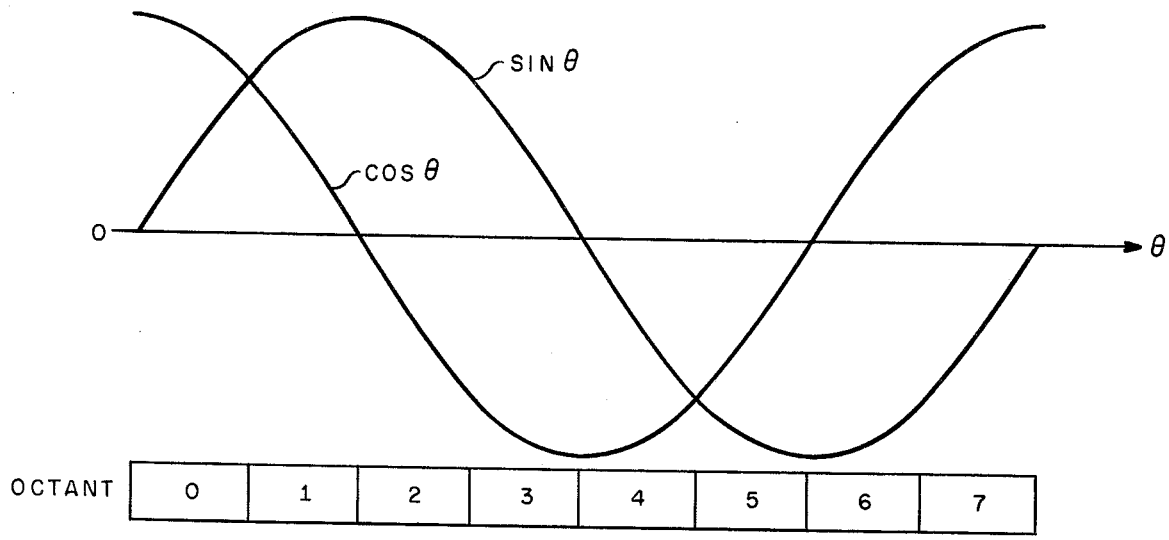
Figure 4B:
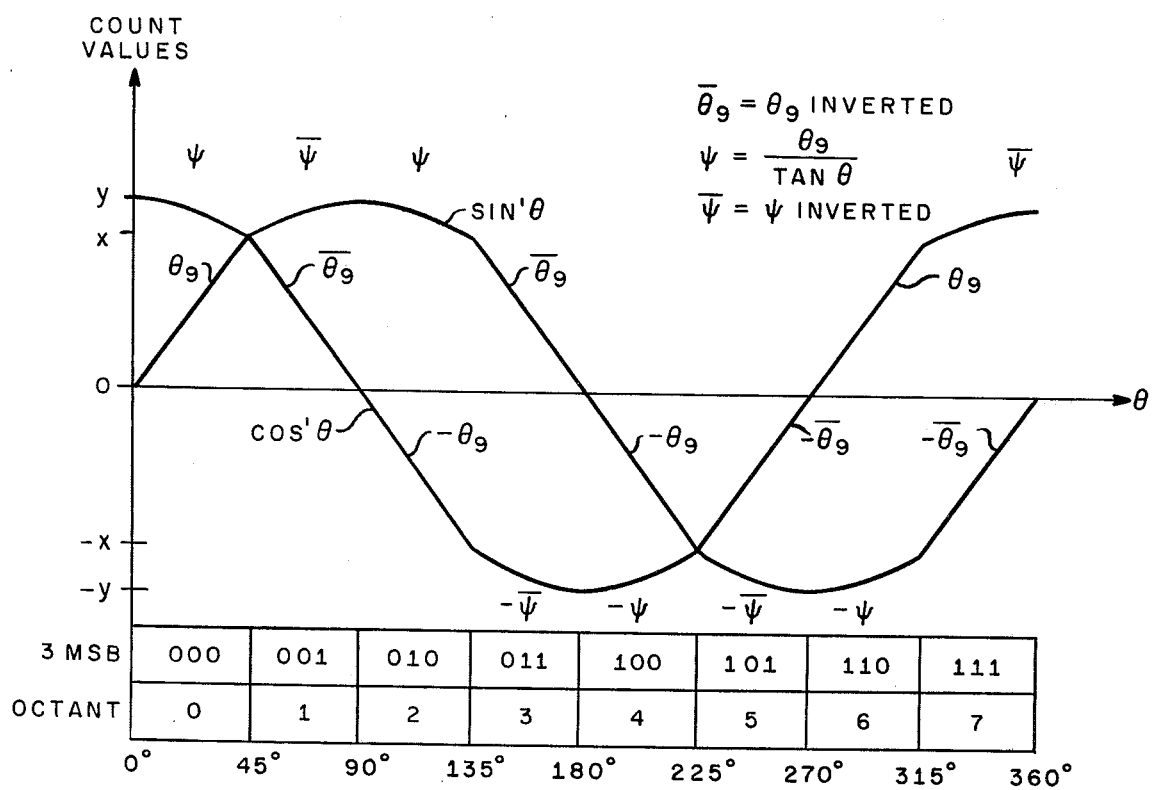

In FIG. 4A conventional sine and cosine functions are illustrated. It is observed that the sine and cosine functions are identical curves displaced 90° and consist of substantially linear portions and curved portions in each octant. Referring now to FIG. 4B, the sine function from 0° to 45° may be approximated by or represented as a straight line in the octant from zero to some count value x (to be explained), and the cosine function from 45° to 90° may also be approximated by or represented as a straight line from the count value x back to zero and is a mirror image of the sine function. Likewise the cosine function from zero degrees to 45° and the sine function from 45° to 90° are curvilinear, denoted by $\Psi$, from the count value y to the count value x and vice versa and again mirror images of each other. Accordingly, the sine and cosine functions from 0° to 360° may be represented by pseudo sine ($\sin'\theta$) and pseudo cosine ($\cos'\theta$) curves which comprise a number of straight line portions and curved line portions. The straight line and curved line portions all have the same slopes and curvatures respectively (depending upon the scale chosen) but are positive going, negative going and/or are mirror images of each other depending upon their location in each octant. Thus, pseudo sine and pseudo cosine values of a given input angle may be readily generated from the straight and curved line segments if the octant in which the given angle is located may be identified. In the present invention the 3 MSB's perform the location function while the remaining 9 bits locate the angle within the octant identified and so identified, determine the signs and slopes of the line portion. Whole generation of the straight line portions or segments pose no problem, the curved line segments require more attention. The present invention greatly simplifies this task since the pseudo sine and pseudo cosine outputs are to be used to generate the tangent of the true angle, such as in a synchro resolver type device wherein voltages proportional to the sine and cosine of an angle combine to produce a resultant electromagnetic vector equal to the tangent of the angle. In such an application, since the tangent of any angle is known if the sine of an angle is given, the cosine of that angle is determinable or if the sine is approximated (the pseudo sine) the cosine may be correspondingly approximated (the pseudo cosine) to yield a true tangent. Thus, in the present invention, for each straight line octant segment representing the pseudo sine (or pseudo cosine) a corresponding curved segment representing the pseudo cosine (or pseudo sine) respectively for that octant may be determined from the known tangent values for that octant. These segments, when properly combined, result in what will be referred to herein as pseudo sine ($\sin'\theta$) and pseudo cosine ($\cos'\theta$) functions which represent the true tangent (Tan $\theta$) function. Expressed mathematically:

$$\frac{\text{pseudo } \sin'\theta}{\text{pseudo } \cos'\theta} = \tan\theta = \frac{\text{true } \sin\theta}{\text{true } \cos\theta} \quad (1)$$

FIG. 4B illustrates these pseudo sine and pseudo cosine curves and the generation thereof from the digital input angle data will now be described. It will be noted that the transition points between line segments occurs at the octant boundaries where the absolute values of the pseudo sine and pseudo cosine are equal. Considering octant 0 (0° to 45°) the straight line segment is $\theta_9$ (representing the nine LSB's of the 12 bit digital input word and a corresponding count from 0 to x) while the curved line segment $\Psi$ represents the locus of counts (the count originating at the 0 count axis) from y to x corresponding to 8 of the 9 bit word $\theta_9$ that is necessary to ensure that the ratio between the counts at each bit location of the two line segments $\theta_9$ and $\Psi$ is equal to tan $\theta$. That is, for each value of $\theta$ the value of $\Psi$ is determined by the equation $\Psi = \theta_9 \tan\theta$. A portion of $\Psi$ is illustrated as the upper step or staircase curve 19 in FIG. 2 which may be approximated by the dashed line 19. This $\Psi$ count value is equivalent to $\cos'\theta = \sin'\theta/\tan\theta$ for this octant in accordance with equation (1) above. Therefore, in the illustrative case, octant 0, $\sin'\theta$ is represented by linear counts 0 to x and $\cos'\theta$ (the pseudo cosine) is represented by counts $\Psi$, i.e., predetermined non-linear counting from counts y to x. In one typical case for the 12 bit number example, count x=511 and count y=652.

It will be appreciated that as in many digital systems wherein lines or curves represented by digital counts intersect, the actual intersection occurs at one-half LSB. Thus, in the present example each intersection is accurate to a one-half LSB as illustrated in FIG. 2.

In the next octant, octant 1, the pseudo sine and pseudo cosine curves are mirror images of each other; that is, the $\cos'\theta$ decreases linearly from count x to 0; while the $\sin'\theta$ increases non-linearly from count x to count y in accordance with $\Psi$. These count values repeat from octant to octant with the polarities and slopes being as illustrated in FIG. 4B. Note that for each value of $\theta_9$ there is a unique value of $\Psi$ in every octant and that $\theta_9$ or $\Psi$ or both may be positive, negative or mirror images. Thus, it is evident that the absolute count values of $\Psi$ remain the same in all octants and it is these values only that need to be stored in the "look up" ROM or PROM and it is only necessary that the data taken out of the ROM is in the proper order, this being assured by inverting $\theta_9$ in the appropriate octant as illustrated in FIG. 4B by $\overline{\theta_9}$, where $\overline{\theta_9} = \theta_9$ inverted.

It should be pointed out that in practice the value of the curved line segment $\Psi$ is always greater than or equal to the value x. To determine the values of $\Psi$ above x the 9 LSB of input data are used to address a PROM whose output is an 8-bit data word. The PROM is addressed by 9 bits because of the 512 discrete values of $\theta$ in each octant for which the value of $\Psi$ is to be determined. The possible values that $\Psi$ can take above x, however, can be described adequately by 256 discrete levels or 8 bits.

As stated above, the 3 MSB's of each 12 bit input angle word determines or identifies the octant while the remaining LSB's ($\theta_9$) are used as the straight line segments and each of these in the proper order is used to address the ROM to obtain the corresponding value of the curved line segment $\Psi$. The count values of x=±511 are scale indications of the values where $\cos'\theta$ and $\sin'\theta$ have the same values. The count values of y=±652 result when the curve line segment has the proper tangent value to the straight line segment as this segment count value approaches zero. Of course these scale values are applicable to the 12-bit word of this illustrated embodiment and would accordingly change for different word lengths.

Having now generally set forth the basic principles of the present invention, a preferred embodiment will now be described, reference being made to FIGS. 1A and 1B of the drawings. In this embodiment, the angular digital data is magnetic compass data employed in aircraft navigation systems, which data is usually displayed to the pilot through, for example, a horizontal situation indicator (HSI) 12 shown in FIG. 1B. Typically the compass data displayed on an HSI 12 includes present compass heading as displayed by compass card or dial 40 against index 41, heading select from a remote heading selector as displayed by heading select bug 42 which is read against the compass card 40, select course from a remote course selector as displayed by pointer 43 relative to compass card 40, and the bearing of a selected radio transmitter as displayed by bearing pointer 44 relative to compass card 40. Conventionally, this data is supplied to the indicator in analog format such as by a three wire synchro data transmission system which is used to control position servo-loops through analog electronics and electric motors for mechanically drive the indicator elements. In the present embodiment of the invention, the indicator electronics incorporate the digital-to-analog converter electronics of the present invention responsive to purely digital data inputs representing the compass data which it is desired to display. The position servo loops remain generally the same but instead of using three wire synchros, synchro resolvers are employed and are responsive to the analog converted pseudo sine and pseudo cosine signals above described.

One of the position servo-loops, the compass card 40 loop 38, is shown in detail in FIG. 1B, which loop comprises a synchro resolver 11 including a stator 11S having conventional sine and cosine windings responsive to the analog pseudo sine, pseudo cosine signals of the invention and a rotor 11R also including sine and cosine windings, the outputs of which are combined to provide a resultant control signal responsive to the rotational position difference between the stator and rotor windings. This signal is demodulated, as by demodulators 37, amplified and applied to servomotor 45 which is geared, through mechanical connection 46, to drive the compass card 40. Mechanical position feedback 47 to resolver rotor 11R assures positional agreement between the electrical vector in resolver stator 11S and the compass card 40 by the motor 45 driving the rotor 11R until its signal output is a null, all in a conventional, closed loop manner. It will be understood that the bearing servoloop 31, select heading servoloop 32 and select course servoloop 33 are all similar and operate in a similar fashion, the selection of the addressed servoloop being performed by a suitable function enable address decoder 23, responsive to dedicated bits of the input digital word, through enable signals 48. The specific enable addresses need not be discussed in detail since they are conventional and well known to those skilled in the art.

Figure 1A:
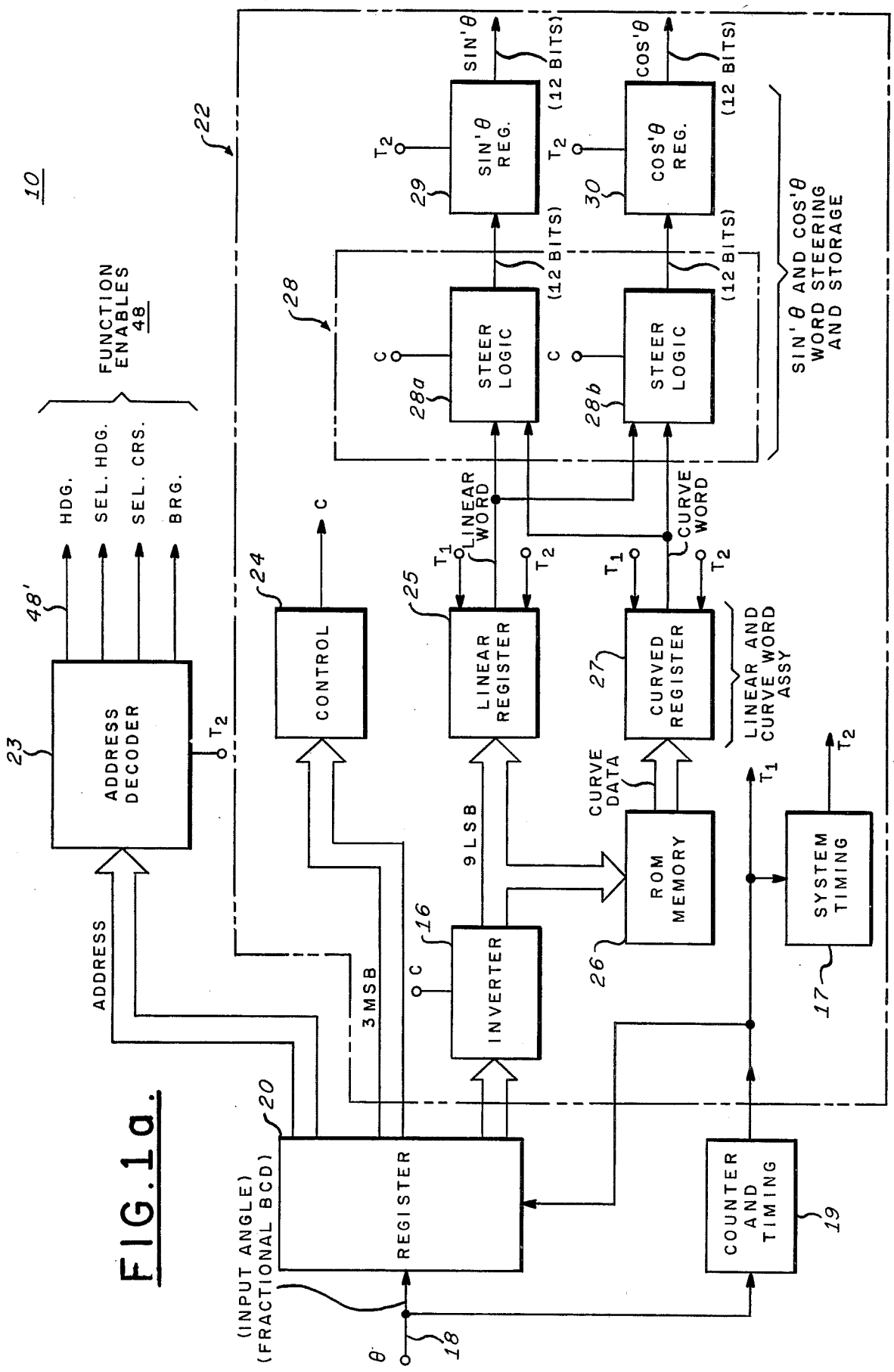

In accordance with the invention, FIGS. 1A and 1B, and the following discussion, it is assumed that the digital data is being supplied from, for example, an area navigation computer and represents the instantaneous compass heading of the aircraft. In this embodiment it is also assumed that the digital compass data is in accordance with the ARINC 582 standard and includes function identification bits and a twelve bit compass data word in fractional binary format as set forth in Table I. This word is normally provided serially and thus provides self-clocking for the converter apparatus.

The serial data input word on lead 18 is counted into input register 20 by counter 19 which also controls the overall conversion system timing $T_1$ and $T_2$ in conventional fashion, $T_2$ being controlled by $T_1$ and timing control 17. The function code bits are separated by the counter and supplied to address register and decoder 23. In the illustrated embodiment, decoder 23 sets the decoder for enabling the HDG line 48' of function enables 48 when this conversion is complete as determined by $T_2$. The 12 bit compass data is outputted as a parallel word from the input register 20 to the pseudo sine and pseudo cosine processor generally outlined by dot-dash line 22 of FIG. 1A, the 3 MSB being supplied to control circuitry 24 which provides ±180° sensing and octant identification switching data for controlling the signs of the straight line and curved line portions and the steering of the proper data to the pseudo sine and pseudo cosine registers 29 and 30 as will be described. The remaining nine LSB's define as a running sum the precise aircraft compass heading within the identified octant with a resolution of ±0.088 degree as shown in Table II.

The 9 LSB's defining the input angle within an octant are applied to an inverter 16 which is controlled from control 24 by the state of the third MSB; when it is a "0" the 9 LSB's are transferred to a straight line or linear register 25 and a PROM 26 without inversion and when it is a "1," they are inverted before transfer to these devices. This inversion requirement is evident from an inspection of the slopes of the curves of FIG. 4A. In octants 0, 2, 4 and 6 no inversion is necessary since the $\Psi$ values are addressed in increasing order of $\theta_9$ in each octant, while in octants 1, 3, 5 and 7 inversion is necessary since the $\Psi$ values must be addressed in the opposite or decreasing order of $\theta_9$. Therefore, this inversion assures that the 9 LSB's are supplied in the proper order so that the proper value of $\Psi$ will be obtained from PROM 26 when addressed by the 9 LSB's for use with the corresponding value of the 9 LSB's in the straight line register 25. Thus, the inverted or non-inverted parallel output from inverter 16 is stored in straight line register 25 and at the same time is used to address PROM 26 to obtain its corresponding value of $\Psi$, the output of the latter being stored in curved line register 27. PROM 26 is a programmed read only memory since it is preprogrammed in accordance with the predetermined values of $\Psi$ as discussed above; i.e., $\Psi = \theta_9/\tan\theta$.

Registers 25 and 27 are used to assemble the properly scaled and signed data word representative of the linear and curved portions of the $SIN'\theta/\cos'\theta$ curves. Scaling is accomplished by setting x as ½ scale. Therefore $\theta_9$ is always less than ½ scale while $\Psi$ is greater or equal to x. The word is assembled and signed for positive values. For negative values the entire word is inverted serially by the steering logic. The 12-bit word is necessary because it is desired to retain the full resolution of $\theta_9$. Therefore 11-bits are necessary while the 12th bit may be used for temperature compensation padding. Thus register 25 contains a 12-bit word representing a properly signed and properly scaled count corresponding to the pseudo sine or pseudo cosine of the input angle $\theta$ within the octant defined by the 3 MSB's, while the curved sector register 26 contains a 12-bit word representing a properly signed and correspondingly scaled count $\theta(x+y)$ corresponding to the pseudo cosine or pseudo sine of the input angle within that octant, the ratio of these counts corresponding to the tangent of the actual input angle $\theta$ within this octant. The counter 19 and timing control 17 are counters while control the loading and unloading of the various registers in a conventional manner. The linear register 25 and curve register 27 therefore constitute a means for assembling the linear and curve portions of the pseudo sine and pseudo cosine components of the input angle.

Having thus obtained the digital values of the pseudo sine and pseudo cosine of the digital input angle defined by the 9 LSB's for the octant identified by the 3rd MSB of the original input word, it is now necessary to assign the polarities of these values as dictated by their relationship in the specific octant identified by the 3 MSB's and to supply them to the proper output registers 29 and 30. This is accomplished in the steering logic 28 which comprises first and second sections 28A and 28B, each responsive to the positively signed linear and curved values of the input angle from registers 25 and 27. The steering logic is controlled from control section 24 in accordance with the octant-defining 3 MSB's. That is, these values are given the polarities (plus and minus) i.e., are inverted or not inverted, as required by the octant in which they are located to generate the pseudo sine of the input angle or the pseudo cosine of the input angle.

For example, if the actual heading angle is in octant 3, FIG. 4B, the linear word portion from register 25 is not inverted since the value of the sine in this quadrant is positive, and is therefore applied by steering logic 28 to the pseudo sine register 29, while the curved word portion is inverted because in this quandrant the cosine is negative and is steered by the steering logic 28 into pseudo cosine register 30.

In the heading mode under consideration, the pseudo sine and pseudo cosine angle data in registers 29 and 30 is counted out by timing $T_2$ and is stored in suitable conventional latches generally indicated at 36. Upon receipt of the heading function enable on lead 48' again controlled by timing $T_2$, the digital pseudo sine and pseudo cosine data is outputted to conventional multiplying digital-to-analog converters (MDAC's) 35' where this data is converted to analog pseudo sine and pseudo cosine voltages which have been modulated by standard 400 Hz ac voltage. Thus the outputs of the MDAC's 35 are two signals proportional respectively to $\sin'\theta \sin \omega t$ and $\cos'\theta \sin \omega t$ which are used to energize the stator windings 11S of synchro resolver 11 of the heading or compass card servo loop 38. There results from these pseudo sine and pseudo cosine voltages a resultant electromagnetic vector in the resolver stator precisely proportional to the tangent of the original digital input angle.

The operation of the system may be further appreciated by considering the following example. Assume that the digital heading angle is 240° and hence is 15° into octant 5. The 12-bit input word counted into and stored in input register 20 is in accordance with Table II, the three MSB's (101) identifying the 5th octant, the 9 LSB's (010101010) specifying an additional 15° and a corresponding quantum count of 170. These 9 bits are inverted by inverter 16 (since the third MSB is a 1) and loaded into linear register 25. Since the bit order has been inverted the count in this register is 341 or in effect which is (511−170) inverted later to be explained herein to −341 which represents pseudo cos 240°. This same inverted 9 bit word is used to address the ΨROM 26 which outputs to register 27 an 8 bit word (since that's all that's needed for the count difference involved) corresponding to a count of Ψ>512. The ROM value of Ψ is 125, that is, a Ψ count of 637 which represents pseudo sin 240°.

System timer 17, synchronized by counter 19, outputs the contents of registers 25 and 27 to the steerings logic 28 which has been set by the 3 MSB's of the original input word to invert the counts of registers 25 and 27 to provide the negative (−) pseudo sine and negative (−) pseudo cosine counts and to supply the same to the pseudo sine output register 29 and the pseudo cosine output register 30.

While the invention has been described in its preferred embodiment, it is to be understood that the words which have been used are words of description rather than of limitation and that changes within the purview of the appended claim may be made without departing from the true scope and spirit of the invention in its broader aspects.

I claim:

1. Apparatus for converting an (n+3) bit digital signal representative of input angular data into output pseudo signals representative of the sine and cosine components of the digital input angular data wherein the pseudo sine and pseudo cosine components are represented by a linear portion for one of the components and a curved portion for the other component in predetermined angular octants identified by the 3 MSB of said digital signal and wherein in each of said octants the ratio of the pseudo sine to the pseudo cosine components is equal to the true tangent of the input angular data comprising:

first means responsive to n bits of the digital signal for linearly decoding said (n) bits to provide a first digital signal representative of a value of the linear portion of one of said pseudo sine and pseudo cosine components of said input angular data, second means including addressable memory means responsive to said (n) bits of the digital signal for providing a second digital signal corresponding to a value of the curved portion of said other component which when algebraically combined with said first digital signal represents the other of said pseudo sine and pseudo cosine components, and third means responsive to the three most significant bits of said digital signal and said first and second digital signals for identifying said angular octant and algebraically combining appropriate ones of said pseudo sine and pseudo cosine components such that the ratio of said pseudo sine to said pseudo cosine component is equal to the true tangent of said digital input angular data in said octants with an (n+3) bit resolution.

2. The converter apparatus according to claim 1 wherein said addressable memory means includes a store of digital values corresponding to said curved portions of said pseudo sine and pseudo cosine components for one of said octants, said memory being addressed by said digital values of said linear portions of said pseudo sine and pseudo cosine components.

3. The converter apparatus according to claim 2 wherein said digital signal is a multi-bit digital word and wherein said first part thereof comprises a first predetermined number (n) of bits, wherein the first means includes a first register means responsive to said first predetermined number of bits for assembling corresponding digital words representative of said linear portion of the pseudo sine and pseudo cosine components in said predetermined octants and said memory means being addressed by the output of said first register, and wherein said second means includes second register means responsive to said memory means for assembling digital words corresponding to said curved portion of said cosine and sine components in said pseudo cosine and pseudo sine predetermined octants.

4. The converter apparatus according to claim 3 wherein the second part of said multi-bit digital word comprises said 3 MSB, and wherein said third means comprises
  (a) logic means responsive to said 3 MSB for identifying a predetermined octant,
  (b) third and fourth register means for assembling said representative output pseudo sine and pseudo cosine components, and
  (c) said logic means conducting said linear and curved portions of said pseudo sine and pseudo cosine components from said first and second register means to said third and fourth register means in accordance with said identified octant.

5. The converter apparatus according to claim 4 further comprising
  (a) a device for transforming signals proportional to the pseudo sine and pseudo cosine components of an angle into a signal proportional to the tangent of said input angle, and
  (b) means coupled with said device for supplying the outputs of said third and fourth registers thereto.

6. The converter apparatus as set forth in claim 5 wherein said transformation device comprises a synchro resolver type of device.

7. Apparatus for converting a multi-bit digital word signal representative of an input angle within a full 360 degree range into pseudo sine and pseudo cosine components, the ratio thereof being the true tangent of the angle, the angle being converted into an analog output signal corresponding thereto, comprising
  (a) means including a counter and first register means for separating said digital word into first and second parts, said first part including the three most significant bits identifying the octant containing said input angle and said second part defining a digital linear value representative of a portion of the pseudo sinusoidal components of said input angle in accordance with said identified octant,
  (b) addressable memory means for storing a predetermined digital curved value representative of a second portion of the sinusoidal components of said input angle,
  (c) means for addressing said memory means with said second part of said digital word for supplying said predetermined digital curved value,
  (d) second register means responsive to said second part of said digital word and said memory means for assembling said digital linear value and said digital curved value representative of said one and said second portions of the sinusoidal components of the digital word signal representative of an input angle,
  (e) third register means for assembling a digital output word representative of the pseudo sine of said input angle,
  (f) fourth register means for assembling a digital output word representative of the pseudo cosine of said input angle,
  (g) logic means responsive to said second register means and said three most significant bits of said input angle digital word for supplying one of said digital linear and curved values representative of portions of said pseudo sinusoidal components to said third and the other of said digital linear and curved values to said fourth register means in accordance with the octant containing said input angle, and
  (h) digital-to-analog converter means responsive to the output words of said third and fourth register means for providing pseudo analog signals proportional respectively to said digital output words, whereby the ratio of said pseudo analog signals equals the true tangent of said input angle.

* * * * *